United States Patent [19]
Ebinuma

[11] Patent Number: 5,796,469
[45] Date of Patent: Aug. 18, 1998

US005796469A

[54] EXPOSURE APPARATUS AND DEVICE MANUFACTURING METHOD USING THE SAME

[75] Inventor: Ryuichi Ebinuma, Machida, Japan

[73] Assignee: Canon Kabushiki Kaisha, Tokyo, Japan

[21] Appl. No.: 891,803

[22] Filed: Jul. 14, 1997

Related U.S. Application Data

[63] Continuation of Ser. No. 491,800, Jun. 19, 1995, abandoned, which is a continuation of Ser. No. 266,513, Jun. 27, 1994, abandoned.

[30] Foreign Application Priority Data

Jun. 30, 1993 [JP] Japan ..................... 5-161961
Jun. 30, 1993 [JP] Japan ..................... 5-162253

[51] Int. Cl.$^6$ ............................. G03B 27/42; G03B 27/52
[52] U.S. Cl. ................................. 355/53; 355/30
[58] Field of Search ........................ 355/30, 53, 67, 355/71; 356/401; 250/49.1

[56] References Cited

U.S. PATENT DOCUMENTS

| | | | |
|---|---|---|---|
| 4,786,947 | 11/1988 | Kosugi et al. | 355/30 |
| 4,989,031 | 1/1991 | Kamiya | 355/30 |
| 4,999,506 | 3/1991 | Mizusawa et al. | 250/491.1 |
| 5,063,582 | 11/1991 | Mori et al. | 355/53 X |
| 5,112,133 | 5/1992 | Kurosawa et al. | 356/401 |
| 5,128,975 | 7/1992 | Iwamoto et al. | 378/34 |
| 5,137,349 | 8/1992 | Taniguchi et al. | 355/30 X |
| 5,144,363 | 9/1992 | Wittekoek et al. | 355/53 |
| 5,148,214 | 9/1992 | Ohta et al. | 355/53 X |
| 5,150,391 | 9/1992 | Ebinuma et al. | 378/34 |
| 5,160,957 | 11/1992 | Ina et al. | 355/53 X |
| 5,194,893 | 3/1993 | Nishi | 355/53 |
| 5,270,771 | 12/1993 | Sato | 355/53 |
| 5,281,996 | 1/1994 | Bruning et al. | 355/77 |
| 5,291,240 | 3/1994 | Jain | 355/53 |
| 5,317,615 | 5/1994 | Ebinuma et al. | 378/34 |
| 5,440,394 | 8/1995 | Nose et al. | 355/53 X |

FOREIGN PATENT DOCUMENTS 61-251025 11/1986 Japan .

*Primary Examiner*—Fred L. Braun
*Attorney, Agent, or Firm*—Fitzpatrick, Cella, Harper & Scinto

[57] ABSTRACT

An exposure apparatus in which a portion of a pattern of a reticle is projected onto a wafer and in which the reticle and the wafer are scanned synchronously such that the pattern of the reticle is transferred to the wafer. The apparatus includes a reticle stage and a wafer stage for scanningly moving the reticle and the wafer, respectively, a measuring system for measuring a deviation of the reticle stage relative to the wafer stage in a predetermined direction other than the direction of scanning movement, and an adjusting device for adjusting the wafer stage on the basis of the measurement by the measuring system. In one aspect, the measuring system includes a laser interferometer. In another aspect, a frame member is provided for supporting the stages, and a flow passageway is provided in the frame member for flowing therethrough a temperature adjusting medium. In yet another aspect, the present invention is directed to an exposure method for the manufacture of microdevices.

38 Claims, 11 Drawing Sheets

EXPOSURE APPARATUS AND DEVICE MANUFACTURING METHOD USING THE SAME

This application is a continuation of prior application Ser. No. 08/491,800, filed Jun. 19, 1995, which is a continuation of prior application Ser. No. 08/266,513, filed Jun. 27, 1994, both now abandoned.

FIELD OF THE INVENTION AND RELATED ART

This invention relates to an exposure apparatus for transferring by exposure a pattern of an original onto a substrate.

As an example of exposure apparatus for manufacture of microdevices such as semiconductor integrated circuits, for example, there is an exposure apparatus by which a portion of a pattern of a reticle is projected onto a wafer while the reticle and the wafer are scanned synchronously, whereby the whole pattern is transferred onto the wafer.

Japanese Laid-Open Patent Application, Laid-Open No. 251025/1986 discloses an exposure apparatus for manufacture of liquid display panels, wherein a pattern of a photomask is projected onto a glass substrate by a mirror projection optical system, while a mask stage carrying the photomask thereon and a substrate stage carrying the substrate thereon are moved synchronously, whereby scanning exposure is performed.

FIG. 13 shows this type of exposure apparatus. Denoted in the drawing at 90 is an illumination optical system for illuminating a mask 91 with light from a light source. Denoted at 96 is a mirror optical system for projecting an image of a pattern of the mask 91 onto a substrate 97, at a unit magnification. Denoted at 92 and 99 are a mask stage and a substrate stage, respectively. Denoted at 93 and 98 are motors for driving the stages, respectively. Denoted at 94 and 95 are distance measuring devices each such as a laser interferometer, for example, for monitoring the position of the stage 92 or 99. By means of the precision of guiding, it is assured that, in the direction perpendicular to the direction of scanning, no positional deviation of the stages 92 and 99 is caused. As for such guiding means, for example, air bearing means having good rectilinearity may be used.

Usually, a semiconductor device is manufactured by superposedly printing different patterns on one and the same wafer. In a scanning exposure method, in the exposure process of a second layer or a layer after this, local alignment is attainable within a pattern on the basis of alignment marks provided in the process of the preceding layer. In the exposure process of a first layer, on the other hand, the scan precision largely affects the position of an image transferred, and it may cause image distortion.

One factor of such image distortion is the effect of rectilinearity of scanning movement. In a scanning exposure method, if a scan stage does not move exactly rectilinearly during the image transfer operation, a transferred image is distorted. In a case where the linewidth of a pattern to be transferred is very small and only a small image distortion in the exposure process is unwanted, minute displacement in any direction other than the scanning direction which cannot be completely avoided even by the rectilinearity of air bearing means such as described above presents a non-negligible effect. For example, in a case where an air bearing means has rectilinearity of 0.2 micron, if the linewidth of a pattern to be transferred is 0.4 micron, then there is a possibility of positional deviation of about a half of the linewidth. Thus, good performance of image transfer is not accomplished.

Another factor of image distortion is the effect of relative deviation of the two stages in the scanning direction. With scanning movement of the reticle stage, the image of the pattern of the reticle projected on the wafer displaces along the wafer surface. If the direction of displacement of the projected image is not registered with the direction of scanning movement of the wafer stage, the image of the pattern as transferred is, as a whole, distorted obliquely. As a result, even by superposition of patterns, good alignment performance is not attainable. Such distortion of a transferred image cannot be neglected because of reduction in size of a pattern to be transferred.

SUMMARY OF THE INVENTION

It is accordingly an object of the present invention to provide an improved exposure apparatus of scanning exposure type by which good transfer precision is attainable.

It is another object of the present invention to provide an improved device manufacturing method based on such exposure apparatus as described above.

In accordance with an aspect of the present invention, there is provided an exposure apparatus in which a portion of a pattern of an original is projected onto a substrate and in which the original and the substrate are scanned synchronously such that the pattern of the original is transferred to the substrate, said apparatus comprising: first and second stages, one of which is for scanningly moving the original and the other of which is for scanningly moving the substrate; measuring means for measuring a deviation of said first stage in a predetermined direction other than the direction of scanning movement; and compensating means for reducing an effect of the deviation of the first stage on the basis of measurement by said measuring means.

In accordance with another aspect of the present invention, there is provided an exposure apparatus in which a portion of a pattern of an original is projected onto a substrate and in which the original and the substrate are scanned synchronously such that the pattern of the original is transferred to the substrate, said apparatus comprising: a stage for scanningly moving one of the original and the substrate; a reference member provided on said stage and being adapted to be used for measurement of the position of said stage; and detecting means cooperable with said reference member, for detecting the direction of scanning movement of said stage.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
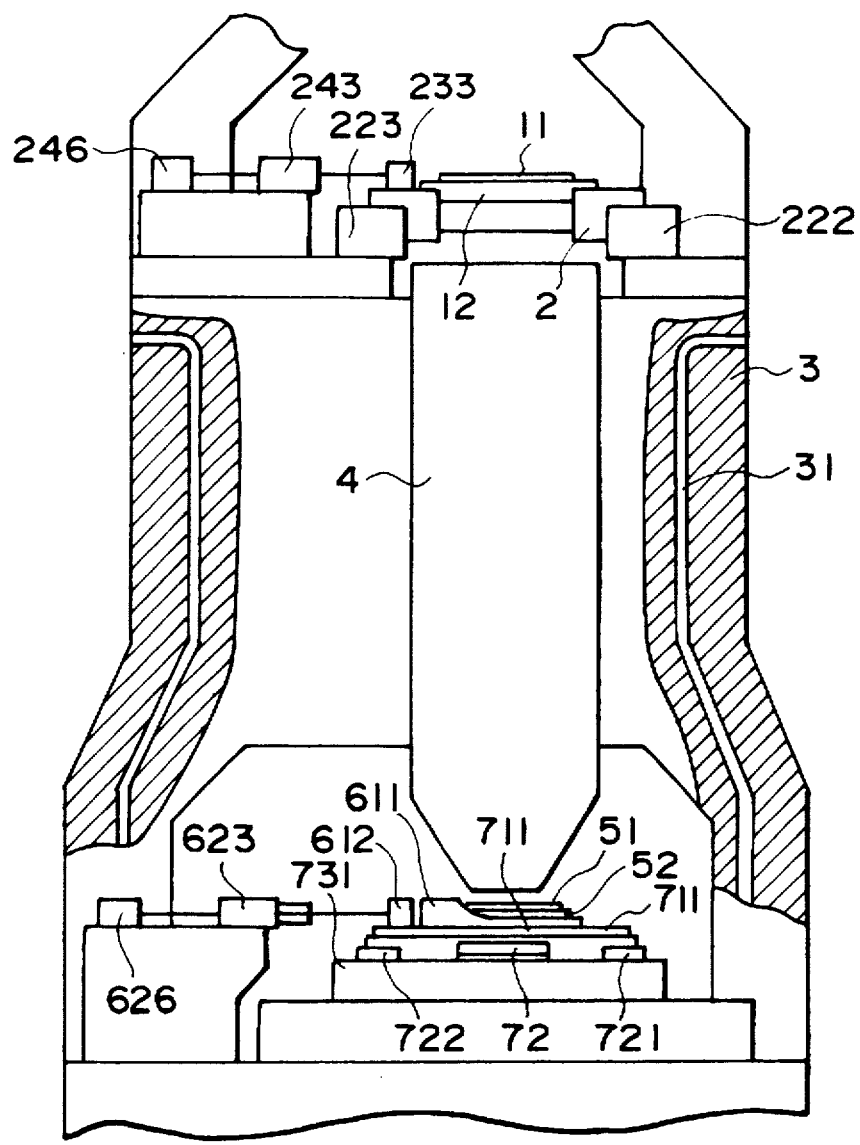
FIG. 1 is a schematic view of an exposure apparatus according to an embodiment of the present invention.

Referring to the drawings, an embodiment of the present invention will be explained. In this embodiment, the invention is applied to a step-and-scan type exposure apparatus wherein a portion of a pattern of a reticle (original) is projected onto a wafer in a reduced scale and, on the other hand, the reticle and the wafer are scanningly moved along the plane of projection synchronously, and wherein after the transfer of a pattern to one zone is completed the wafer is stepped and the transfer of the pattern to another zone is repeated. With repetitions, plural patterns are printed in arrays on the whole surface of the wafer.

Figure 2:
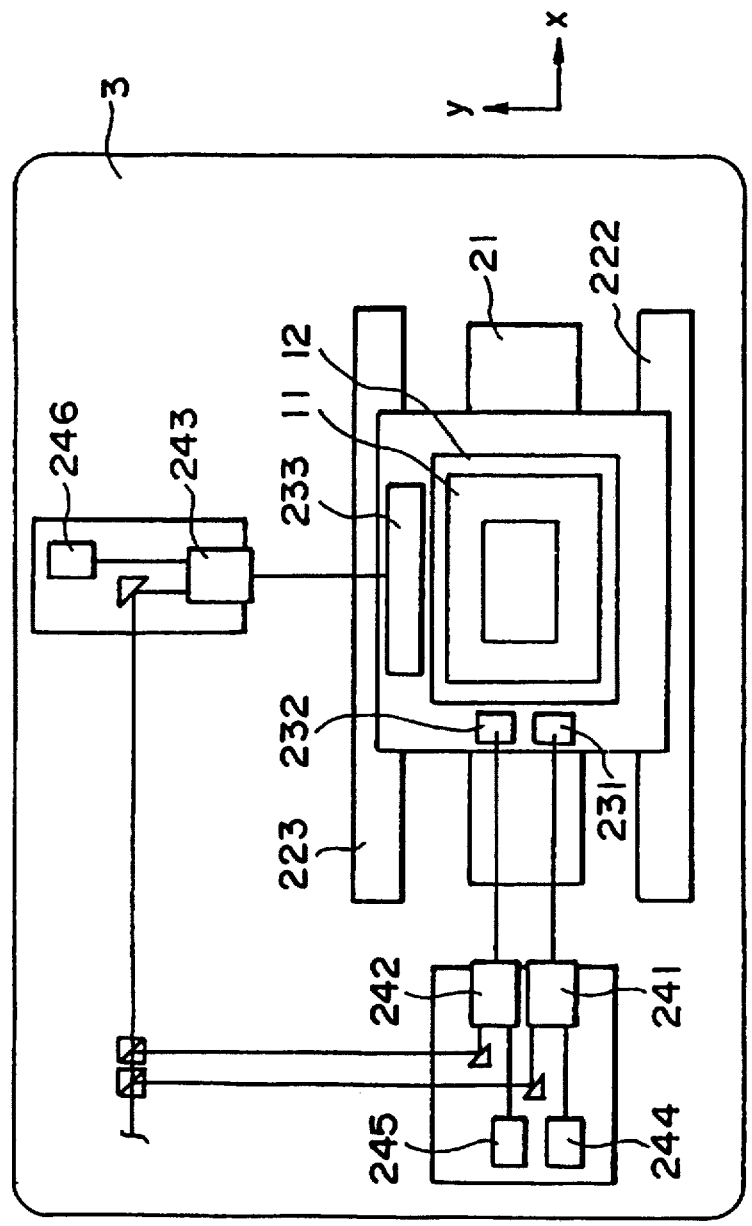
FIG. 2 is a schematic view of a reticle stage of an exposure apparatus of an embodiment of the present invention.
Figure 3:
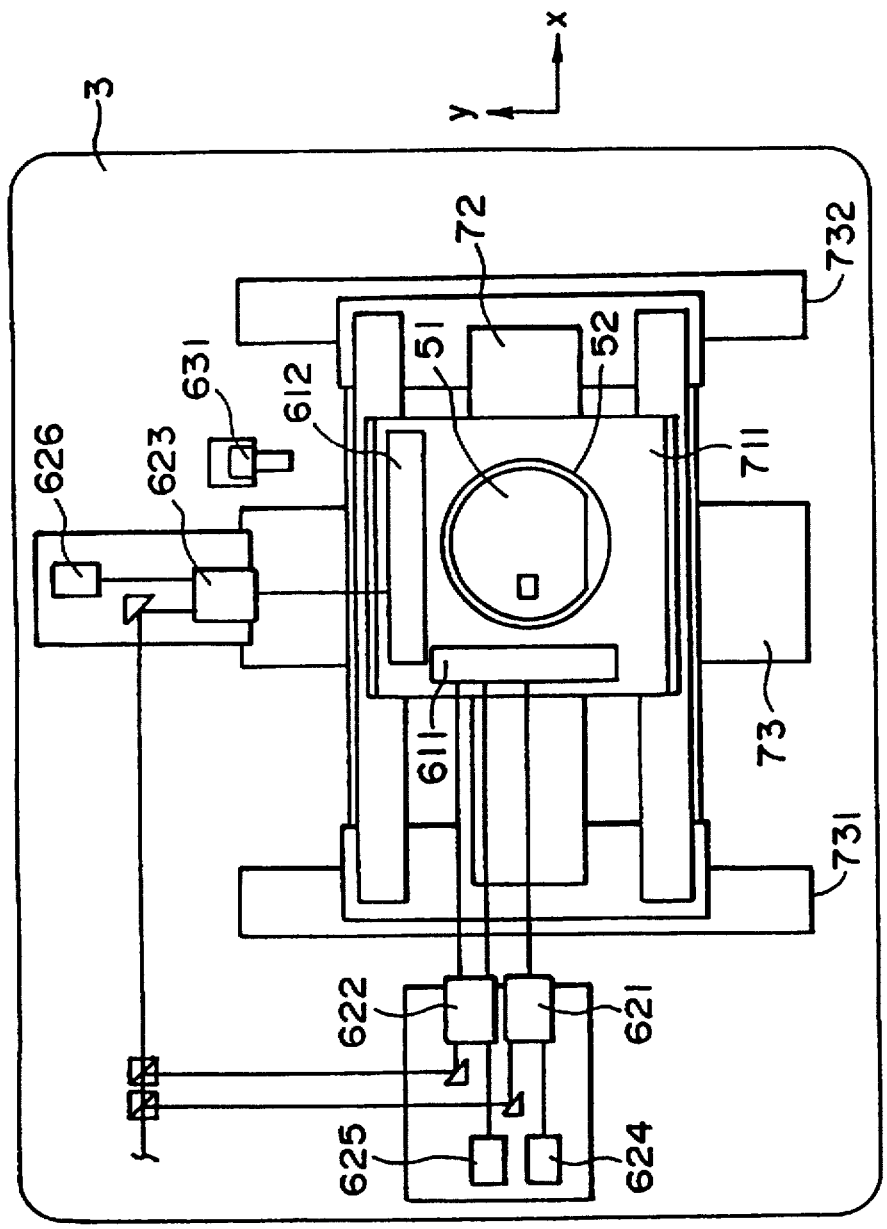
FIG. 3 is a schematic view of a wafer stage of an exposure apparatus of an embodiment of the present invention.
Figure 4:
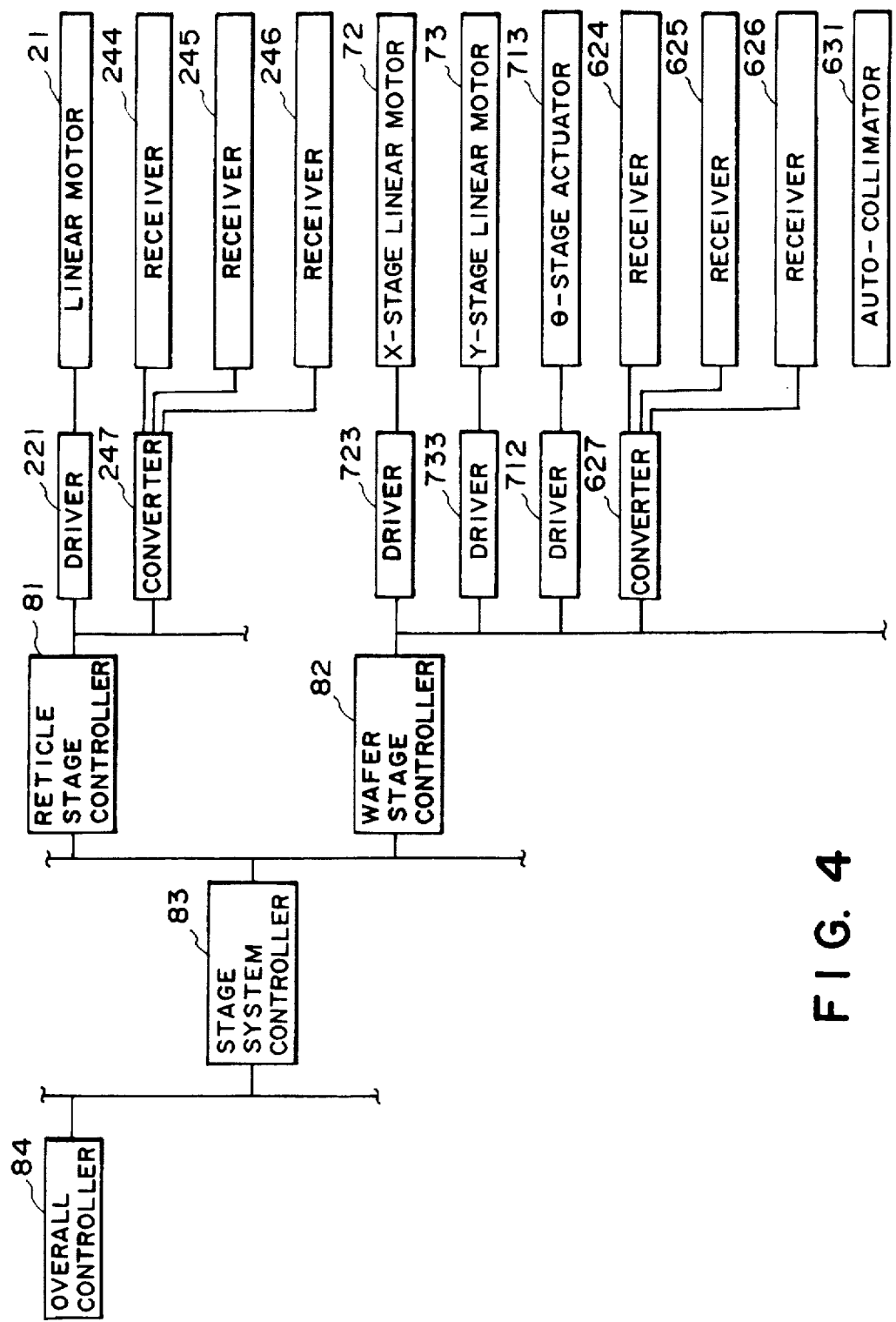
FIG. 4 is a block diagram of a stage controlling system of an exposure apparatus of an embodiment of the present invention.

FIG. 1 is a side view of the exposure apparatus. FIG. 2 is a plan view of a reticle stage. FIG. 3 is a plan view of a wafer stage. FIG. 4 is a block diagram of a stage control system.

In FIGS. 1, 2 and 4, denoted at 4 is a projection optical system for projecting a pattern of a reticle upon a wafer. It serves to image a portion of the reticle pattern upon the wafer, in a reduced scale of 0.25×. Through cooperation of this projection optical system 4 with an illumination optical system (not shown) for illuminating the reticle, a portion of the reticle pattern is imaged on the wafer in the reduced scale.

Denoted at 11 is a reticle (original) having a pattern to be transferred. Denoted at 12 is a reticle chuck on which the reticle 11 is placed. Denoted at 2 is a reticle stage for performing scanning movement of the reticle. The reticle stage is mounted on a frame 3. The reticle stage 2 includes driving means and guiding means, for the scanning movement of the reticle, as well as measuring means for measuring the position $X_r$ of the reticle in the scanning direction and the attitude thereof with respect to the scanning plane. The driving means of the reticle stage 2 comprises linear motor means denoted at 21. Denoted at 221 is a driver for actuating the linear motor 21 of the reticle stage. The guiding means of the reticle stage 2 comprises air bearing means which includes air pads (not shown) mounted to a movable portion of the stage as well as guide members 222 and 223 for supporting the air pads. The guide members 222 and 223 are supported by the frame 3. The direction of scanning movement of the reticle is regulated by these guide members.

Denoted at 31 is flow passageway means formed within the frame 3, for flowing therethrough a temperature adjusting liquid medium. By flowing temperature adjusting water, for example, having a controlled temperature through this flow passageway means, undesirable deformation of the frame 3 due to a temperature change of ambience or any effect of heat of the driving system can be avoided. The measuring means for measuring the position and attitude of the reticle comprises laser interferometer means. Denoted at 231, 232 and 233 are mirrors for distance measurement which are mounted to a movable portion of the reticle stage. The mirrors 231 and 232 each comprises a corner cube prism. The mirror 233 comprises a flat mirror having a reflection surface of high flatness. It has a reflection surface of a sufficient length relative to the stroke of the reticle stage, and it is fixed parallel to the movement direction of the reticle stage determined by the guiding means. Denoted at 241, 242 and 243 are interferometers mounted on the frame 3. From laser light source means, not shown, laser light is supplied to these distance measuring interferometers and mirrors. The corner cube prism 231, the interferometer 241, the corner cube prism 232 and the interferometer 242 are disposed at symmetrical positions with respect to the center of the exposure region, and at respective positions they serve to measure the position $X_{r1}$ or $X_{r2}$ of the reticle in the scanning direction. Also, by means of the flat mirror 233, the position $Y_r$ in a direction normal to the scanning direction can be measured. Denoted at 244, 245 and 246 are receivers each for converting an output of a corresponding interferometer into an electrical signal. Denoted at 247 in FIG. 4 is a converter for converting outputs of the interferometers into positional signals. Denoted at 81 is a reticle stage controller for controlling the reticle stage on the basis of a position output, in the scanning direction, of the interferometer system.

The position $X_r$ of the center of the reticle in the scanning direction can be determined from an average of the positions $X_{r1}$ and $X_{r2}$ represented by the position output signals of the two interferometers 241 and 242, each for measuring the position of the reticle stage in the scanning direction, in accordance with the following equation:

$$X_r = (X_{r1} + X_{r2})/2 \tag{1}$$

The reticle stage controller 81 supplies a control signal corresponding to this $X_r$ to the driver 221 of the linear motor 21.

Now, the portion around the wafer stage will be explained while referring to FIGS. 3 and 4. The stage system for moving a wafer within the plane of projection comprises an X-Y-θ stage which is movable along the plane of projection, in a rotational direction (θ direction), in a scan direction ($X_w$ direction) and in a direction ($Y_w$ direction) perpendicular to the scanning direction. Denoted at 51 is a wafer having a photosensitive material applied to its surface. Denoted at 52 is a wafer chuck for holding the wafer. The position and attitude of the wafer stage are measured by laser distance measuring means. Denoted at 611 and 612 are flat mirrors, for distance measurement, which are mounted on the wafer chuck 52. Each mirror has a sufficient length relative to the stroke, for assuring scanning exposure of the whole surface of the wafer. Denoted at 621, 622 and 623 are interferometers which are mounted in the frame 3. In this structure, laser light is projected upon the position on the reflection surface of the flat mirror 611 which corresponds to the center of the exposure region, and the position $X_w$ of the wafer in the scanning direction is measured through the interferometer 621. Further, laser light is projected upon two positions on the reflection surface of the flat mirror 611 and, based on interference of light, the rotational position $θ_w$ of the wafer within the plane of projection can be measured. The interferometer 623 serves to measure the position $Y_w$ of the wafer in a direction perpendicular to the scanning direction. Denoted at 624, 625 and 626 are receivers each for converting an output of a corresponding interferometer into an electrical signal. Denoted at 627 is a converter for converting outputs of the interferometers into position signals. Denoted at 631 is an autocollimator mounted on the frame 3, for measuring any tilt of the reflection surface of the distance measuring mirror 612. Denoted at 711 is a θ stage for rotationally moving the wafer along the image plane. Although details of it are not illustrated, it has an actuator comprising a piezoelectric device, for example, as well as guiding means comprising radially disposed leaf spring members, for example.

Denoted at 712 is a driver for actuating the θ stage. The rotational stage is mounted on an X stage for movement thereof in the scanning direction. Denoted at 72 is linear motor means of the X stage. Denoted at 721 and 722 are guides of air bearing means of the X stage. Denoted at 723 is a driver for actuating the linear motor means 72. The X stage is mounted on a Y stage which is movable in a direction perpendicular to the direction $X_w$. Denoted at 73 is linear motor means of the Y stage. Denoted at 731 and 732 are guides of air bearing means of the Y stage, which are mounted on the frame 3. Denoted at 733 is a driver for actuating the linear motor means 73. These driving means in respective axes, constituting the wafer stage, are controlled in accordance with position signals from the measuring system of the wafer stage. Thus, the coordinate system of the wafer stage is based on the coordinate system of the measuring system provided by the laser interferometers, and the directions in respective axes of the coordinate system depend upon the attitude of the measuring mirrors 611 and 612. Denoted at 82 is a wafer stage controller for controlling the wafer stage, and denoted at 83 is a stage system controller for controlling the operations of the reticle stage and the wafer stage. Denoted at 84 is a controller for controlling the exposure apparatus as a whole.

Figure 5:
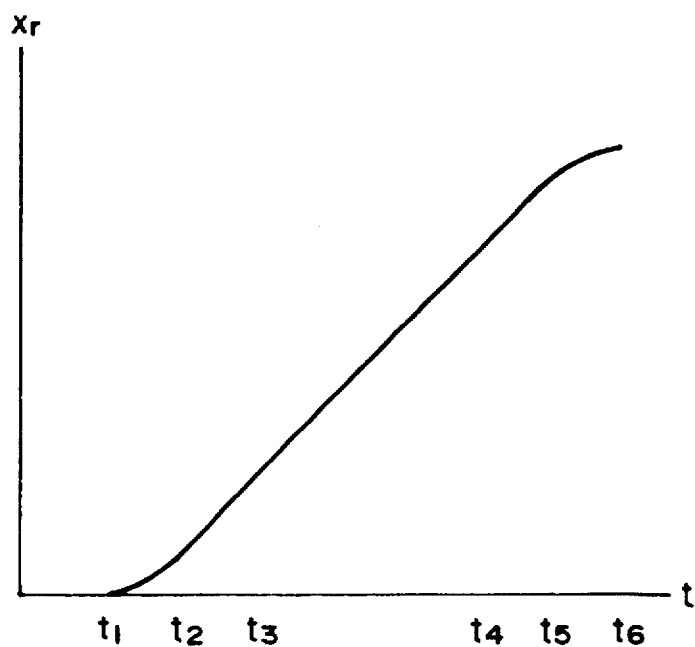
FIG. 5 is a graph for explaining a designated value for scanning movement of a reticle stage.

Exposure operation for a first layer of a wafer in the exposure apparatus of the structure described above, will now be explained. FIG. 5 illustrates the relationship between designated position $X_r$ in the scanning direction of the reticle stage and time. In this drawing, time $t_1$ is the moment at which movement of the reticle stage starts. With the start of movement, acceleration is initiated until a predetermined speed is reached. Time $t_2$ is the moment at which the acceleration is finished. From this moment, the reticle stage moves at a constant speed. Time $t_3$ is the moment at which the exposure operation starts. At this moment, the pattern of a reticle enters the exposure region, and the pattern is projected onto a wafer. Time $t_4$ is the moment at which the exposure operation is finished. Time $t_5$ is the moment at which deceleration of the wafer stage starts. Time $t_6$ is the moment at which movement is finished. The stage system controller 83 supplies signals to the reticle stage controller 81 so as to move the reticle stage in accordance with a predetermined movement pattern such as illustrated in FIG. 5, for example.

Figure 6:
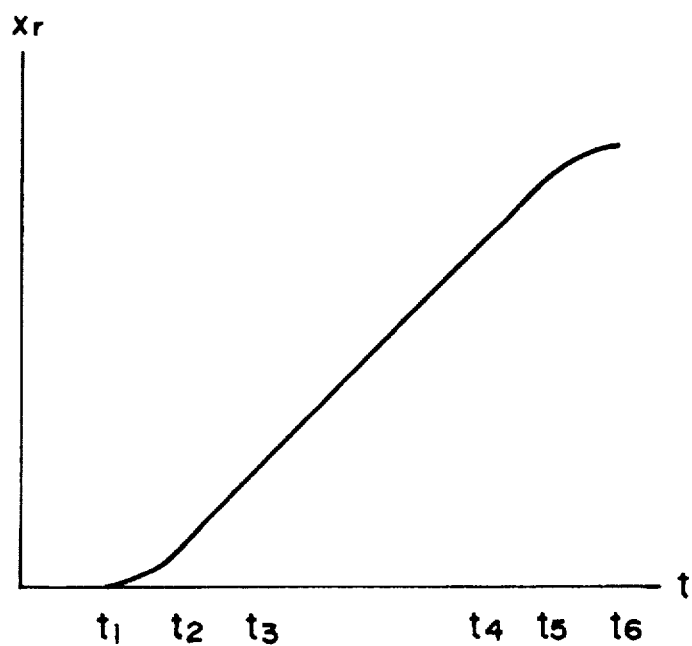
FIG. 6 is a graph for explaining a measured value with respect to the position of a reticle stage in a scanning direction.

FIG. 6 illustrates the relationship between the measured position $X_r$ of the reticle in the scanning direction and time, and the illustrated relationship corresponds to the result of movement operation of the reticle stage in the scanning direction, actually moved in accordance with signals as represented in FIG. 5. There is a small difference between what is illustrated in FIGS. 5 and 6.

Figure 7:
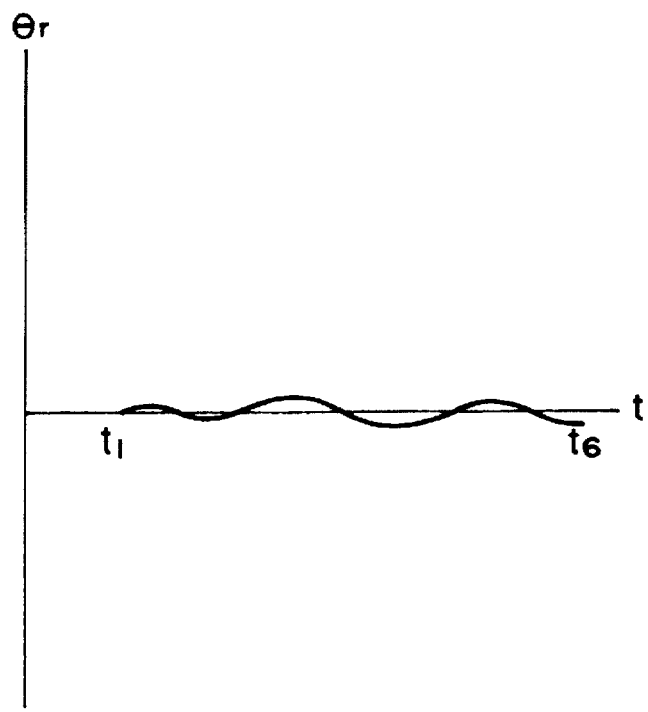
FIG. 7 is a graph for explaining a measured value with respect to the position of a reticle stage in a rotational direction.

FIG. 7 shows a result obtained by dividing, by length L, the difference between the position output $X_{r1}$ of the interferometer and the position output $X_{r2}$ of the interferometer 242, that is, the relationship between the rotational position $θ_r$ of the reticle and time. The following relation represents this:

$$θ_r = (X_{r1} - X_{r2})/L \qquad (2)$$

Figure 8:
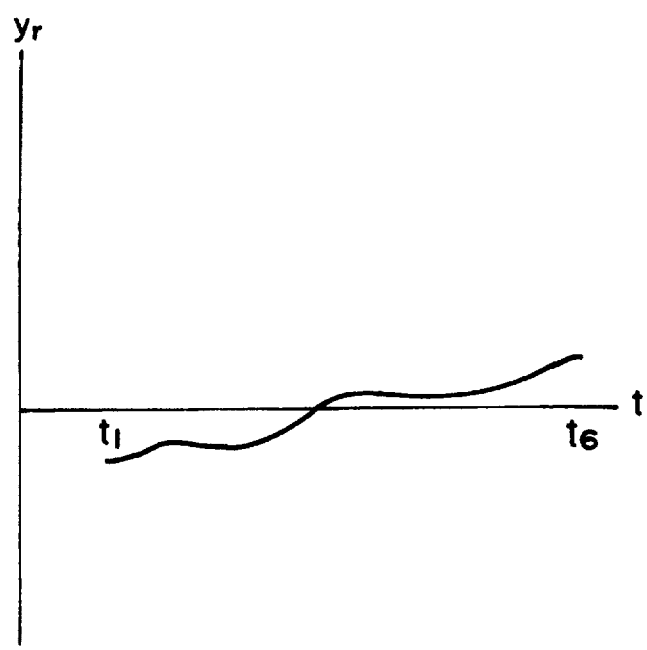
FIG. 8 is a graph for explaining a measured value with respect to the position of a reticle stage in a direction perpendicular to a scanning direction.

FIG. 8 shows the relationship between the position output of the interferometer 243, i.e., the position of the reticle in a direction perpendicular to the scanning direction, and time. In FIGS. 7 and 8, unwanted movement components in a direction or directions other than the direction of scanning movement of the reticle stage, are included. Main factors of such unwanted movement components may be nonrectilinearity of the guide members 222 and 223 of the air bearing means of the reticle stage and any external disturbance vibration adversely affecting the reticle stage.

It is to be noted that the measured values contain measurement errors. In the measured value $Y_r$ of FIG. 8, the flatness of the measuring mirror 233 affects measurement error and, thus, the measured value may contain an error of about 10 nm, for example. Additionally, there may be an error component attributable to a tilt angle α (deviation from parallelism) between the measuring mirror 233 and the scanning movement direction of the reticle stage.

The positional information as represented in FIGS. 6, 7 and 8 is supplied to the stage system controller 83. In the stage system controller 83, it is transformed by calculation into the position on the wafer stage and, then, is transformed into driving amounts of respective stages constituting the wafer stage.

The direction of the scanning movement of the reticle stage in this embodiment is determined with reference to the guide members 222 and 223 of the reticle stage. On the other hand, the coordinate system of the wafer stage is determined with reference to the measuring system provided by the laser interferometers. With respect to the X-axis direction, the measuring flat mirror 612 on the wafer stage provides a reference. With scanning movement of the reticle stage, the projected image of the pattern of the reticle being projected on the wafer displaces. The movement direction of the projected image may not necessarily be registered with the direction of the X axis of the wafer stage coordinate system. Movement with harmonized or coordinated X and Y axes of the wafer stage enables registration of the direction of scanning movement of the wafer with the direction of scanning movement of the projected image. The angle β defined between the direction of the X axis of the coordinate system of the wafer stage, determined by the measuring mirror 612, and the direction of scanning movement of the projected image on the wafer, can be estimated by transferring by exposure a predetermined pattern while keeping registration between the direction of scanning movement of the wafer stage and the direction of the X axis of the coordinate system of the wafer stage and by measuring and estimating image distortion of the thus transferred pattern.

In the scanning exposure, the magnification in the scan direction may be made different from the magnification in the direction perpendicular to the scanning direction. The exposure magnification in the scanning direction is determined by a speed ratio $N_{st}$ between the scanning speed of the wafer stage and the scanning speed of the reticle stage. The exposure magnification in the direction perpendicular to the scan direction is determined by the magnification $N_{op}$ of the exposure optical system.

Thus, within a range in which sinα=α and sinβ=β are considered applicable, the transformation into the position on the wafer stage is determined by the magnitude as represented by the following equations:

$$X_w = N_{st} X_r \qquad (3)$$

$$Y_w = N_{op}(Y_r + X_r) + \beta N_{sr} X_r \qquad (4)$$

$$\theta_w = N_s \theta_r / N_{op} \qquad (5)$$

Also, in a case where $N_{op} = N_{sr}$, equation (5) may be replaced by:

$$\theta_w = \theta_r \qquad (6)$$

Further, if the controllability of the reticle stage in the scan direction is good, in equations (3) and (4) the measured value $X_r$ of the position of the reticle stage in the scan direction may be replaced by a designated position $X_r$. Here, $X_w$, $Y_w$ and $\theta_w$ correspond to the positions with respect to the X-Y-θ coordinate system of the wafer stage. As regards the transformation into the coordinate system actually determined by the laser interferometers on the wafer stage, since the measurement through a laser interferometer is unable in principle to perform measurement of an absolute position, computation may be made while taking into account that each measured value, including the measured values of $X_r$ and $Y_r$, is the amount of movement from a corresponding predetermined reference position. It is to be noted that each sign in the above equations may be changed in dependence upon the manner of taking the direction of each axis of the corresponding coordinate system.

At least during the exposure operation (i.e., from time $t_3$ to time $t_4$), the wafer stage controller 82 controls the X stage, the Y stage and the θ stage, constituting the wafer stage, so that the position as represented by the above equations and the position of the wafer coincide with each other. In this control, since the driving axes of the wafer stage interfere with each other, the driving amounts in respective axes are controlled by appropriate amounts determined in accordance with the position of the exposure region within the wafer. More specifically, for operation of the θ stage, since the exposure region of the wafer displaces also in the X-axis direction and in the Y-axis direction, the X-axis and Y-axis control is done while taking into account the amounts of displacement in these directions.

With the operations described above, unwanted movement components of the reticle stage can be corrected or compensated through the driving system of the wafer stage. As a result, independently of the rectilinearity of the scanning movement of the reticle stage, rectilinearity of scanning movement is assured with the precision of the measuring system. For example, while the machining precision in respect to the rectilinearity a guide member may be about 0.2 micron, the measuring mirror 233 can be finished with a precision of about 0.02 micron. Roughly stating, the value obtained by multiplying the difference between these precisions by the exposure magnification, may correspond to the improvement of rectilinearity upon the wafer. In this example, image distortion in scanning exposure may be reduced by about 0.045 micron.

If there occurs a change in the angle β defined between the direction of the X axis of the coordinate system of the wafer stage, determined by the measuring mirror 612, and the direction of scanning movement of the projected image on the wafer, then the direction of scanning movement of the wafer stage may be changed in accordance with the above equations and with the change of β, with a result of prevention of oblique distortion of the projected image.

In the exposure apparatus of this embodiment, such a change in angle β may be caused by a change in attitude of the measuring mirror 612 attributable, for example, to the effect of acceleration force applied to the stage. This change in angle β can be determined by, as described, transferring by exposure a predetermined pattern while keeping registration between the direction of scanning movement of the wafer stage with the direction of the X axis of the coordinate system of the wafer stage and by estimating again the image distortion of the thus transferred pattern. Further, it may be determined more easily by measuring through the autocollimator 631 any tilt w of the measuring flat mirror 612 about the θ axis relative to the frame 3. In this method, initially by estimating image distortion of a pattern transferred, any tilt $\beta_0$ between the direction of scanning movement of the projected image and the direction of the X axis of the wafer stage may be detected and, additionally, any tilt $w_0$ about the θ axis of the measuring reflection surface of the flat mirror 612 relative to the frame 3, being measured by the autocollimator 631 during exposure operation for the transfer of that pattern, may be memorized. And, if there occurs a change in measured value w, as measured by the autocollimator, relative to the memorized $w_0$, the amount of change ($=w-w_0$) may be added to the initially estimated $\beta_0$ and the sum may be taken as β. Namely:

$$\beta = \beta_0 + w - w_0 \qquad (7)$$

Using this correction amount enables assurance of constant registration between the direction of scanning movement of a projected image and the direction of scanning movement of a wafer. For measurement of w, the wafer stage may preferably be at the same position and the autocollimator measuring surface of the measuring mirror may preferably be constant. To this end, each axis of the wafer stage has a reference position. Alternatively, registration of the direction of scanning movement of the projected image with the direction of scanning movement of the wafer may be accomplished by moving the θ axis of the wafer stage to rotationally move the measuring mirror 612 about the θ axis and by correcting the reference of the θ axis so that the designated value of the autocollimator becomes equal to $w_0$.

In scanning movement of the wafer, in order to avoid adverse effects of external disturbance vibration or any warp of the guiding means of the air bearing means, position signals produced by measuring means of the laser interferometer system are compared with designated values for the scanning movement and the actuators in respective axes of the wafer stage are so controlled that respective differences are minimized. As regards the measurement of the position (attitude) of the wafer in the θ direction for obtaining a control signal in the scanning movement, it can be measured by measuring the attitudes of the measuring mirrors 611 and 612 on the wafer stage, respectively, by using the laser interferometers. Since however the point of reflection of the laser light upon the measuring mirror 612 displaces continuously with the scan movement, the signal obtained by measuring the attitude of this mirror reflection surface contains a possible variation attributable to small waving of the reflection surface. On the other hand, in the measurement of the attitude of the measuring mirror 611, since the point of reflection of the laser light is unchanged during the scanning movement, any waving component thereof does not result in a measurement error. Thus, a signal obtainable by measuring the attitude of the measuring mirror 611 may preferably be used as a control signal for controlling the θ direction attitude of the wafer during the scanning movement.

A change in the direction of the axis of the coordinate system as determined by the position measuring system of the wafer stage can be detected by measuring the attitude of a measuring mirror on the wafer stage relative to the frame. The attitude of any one of the two measuring mirrors 611 and 612 may be measured for this purpose, provided that these mirrors do not relatively move relative to each other. If, however, the angle defined by the measuring reflection surfaces of these mirrors changes, preferably the attitude of the measuring mirror 612 having its measuring reflection surface disposed parallel to the scanning movement direction may be measured. Measuring the attitude of the measuring mirror 612 and correcting the direction of scanning movement enables avoidance of deviation between the direction of scanning movement of the wafer and the direction of scan movement of the projected image of the reticle pattern, regardless of a change in orthogonality between these two mirrors.

Figure 9:
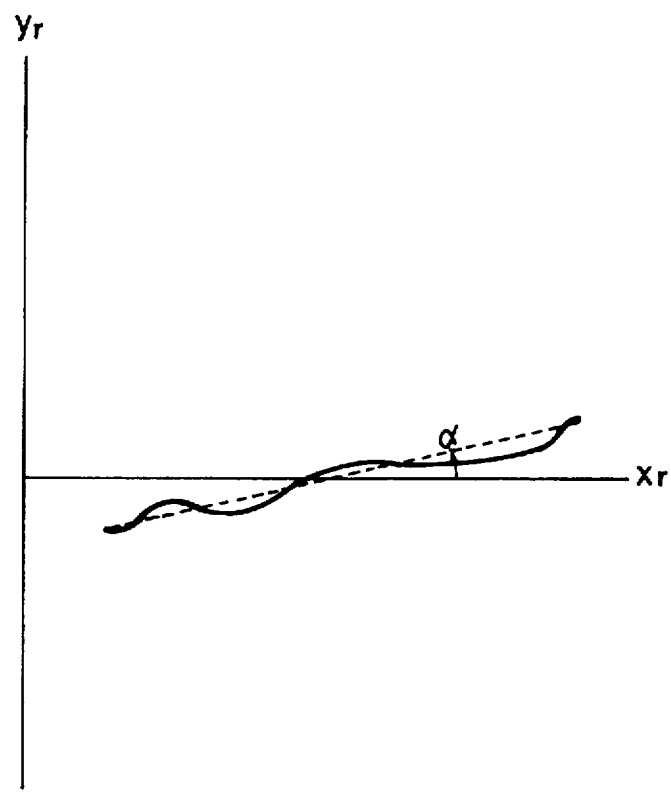
FIG. 9 is a graph for explaining calculation of an angle α.

If there occurs displacement of the measuring mirror 233 on the reticle stage due to a factor such as acceleration force of the reticle stage, for example, and if, as a result, there occurs a change in the tilt angle $\alpha$ defined by the scanning movement direction of the reticle stage and the direction of measuring reflection surface of the mirror 233, then there occurs a change in $Y_r$ such as depicted in FIG. 8. On this occasion, while the scanning movement direction of the projected image is unchanged, according to equation (4) the scanning movement direction of the wafer stage changes with the change in the value $Y_r$. If it results from the displacement of the mirror 233, the change in $Y_r$ resulting therefrom is proportional to the $X_r$, and, therefore, it can be discriminated from that attributable to vibration. In order to avoid this effect, the change in $\alpha$ can be detected by the least square method, for example. In FIG. 9, a solid line curve depicts the value $Y_r$ obtainable by using the measuring reflection surface of the mirror 233 with the scanning movement of the reticle stage. The axis of abscissa denotes the measured value $X_r$ of the position of the reticle stage in the scanning movement direction. A broken line in FIG. 9 depicts a straight line closest to the solid line curve, which can be determined from the value $Y_r$ in accordance with the least square method, for example. If the mirror 233 displaces for any factor and the angle $\alpha$ changes, in response the angle defined between the broken line and the axis of abscissa in FIG. 9 changes accordingly. By applying equation (4) while taking the angle between the broken line and the axis of abscissa in FIG. 9 as $\alpha$, it is possible to avoid a correction error in the scanning direction which otherwise results from failure in registration between the direction of measuring the reflection surface of the mirror 233 and the scanning movement direction of the reticle stage and/or from a change in the relationship between them. As regards the timing of calculation of the angle $\alpha$, since it has to be done before an exposure operation including the correction based on equation (4), as an example, preferably the data $Y_r$ and $X_r$ may be predetected during the scanning movement operation of the reticle stage (which may actually performed prior to the exposure operation so as to detect information related to the positional deviation between the wafer and the reticle) and, based on this, $\alpha$ may be calculated.

The calculation of $\alpha$ may not be based on the least square method. For example, two representative positions of $X_r$ may be set: averages of $Y_r$ in the vicinity of these positions may be calculated, and a resultant obtained by diving the difference between these two averages by the distance between the two positions may be taken as $\alpha$.

Figure 10:
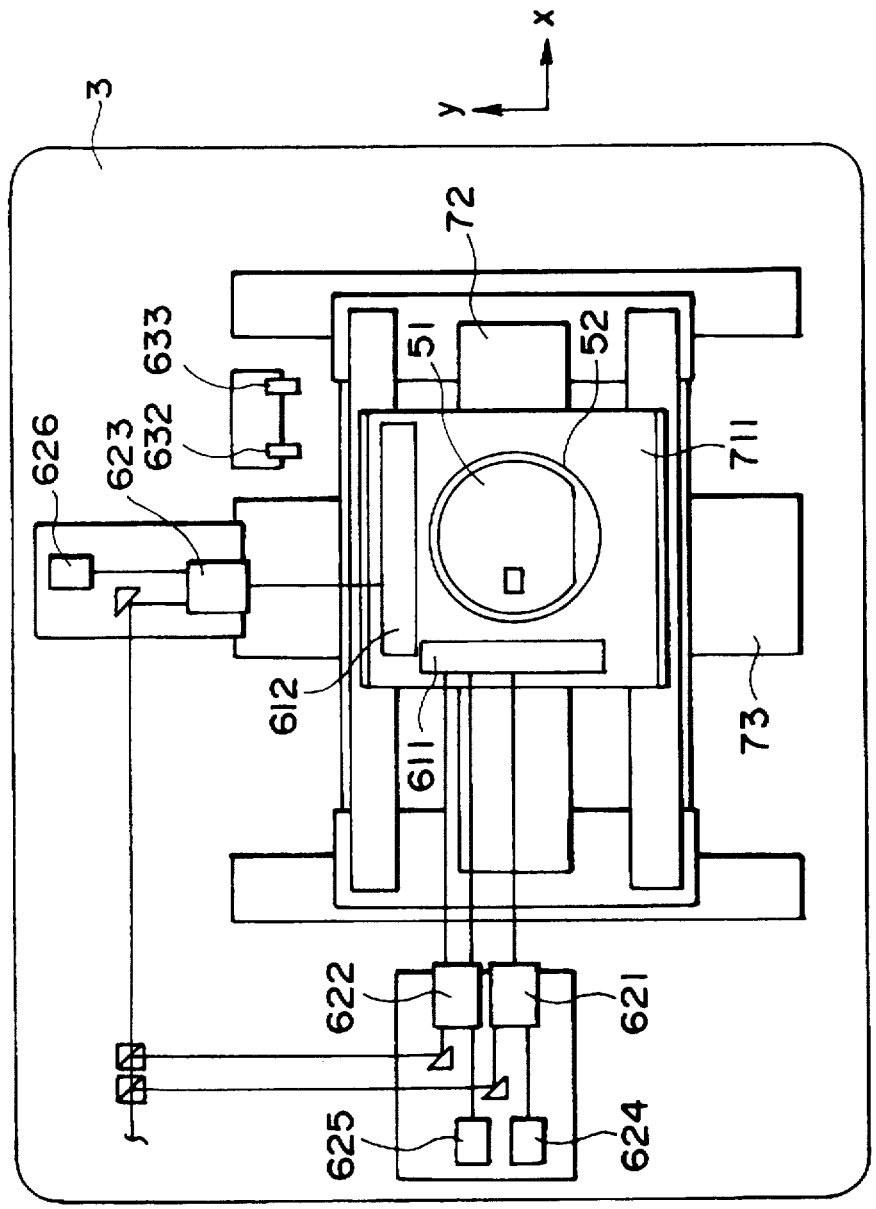
FIG. 10 is a schematic view of an embodiment of the present invention, having means for measuring tilt of a mirror reflection surface.

FIG. 10 is a schematic view for explaining another embodiment for measuring a tilt angle of a measuring mirror. Like numerals as of those of FIG. 3 are assigned to similar or corresponding elements (explanation of such elements is omitted). Denoted at 632 and 633 are non-contact type distance measuring sensors which are mounted on the frame 3. By means of these two sensors 632 and 633, at two locations the distance between the frame 3 and the mirror 612 is measured. From any change in that distance and from the distance between the sensors 632 and 633, $\beta$ can be calculated.

In the embodiments described hereinbefore, the measuring precision obtainable through the flatness of the measuring mirror 233 of the reticle stage is made sufficiently higher than the rectilinearity of the scanning movement of the reticle stage obtainable through the straightness of the guide member of the reticle stage, and this enables minimization of image distortion due to the scanning movement during the exposure operation and thus significant improvement in the pattern transfer performance. Further, the rectilinearity of the scanning movement can be substantively improved without adding a fine motion mechanism to the reticle stage with respect to any direction other than the scan direction or without the necessity of increasing the precision of rectilinearity of the guiding means of the stage. Thus, the cost can be reduced significantly.

Moreover, even if the attitude of a measuring mirror of a laser interferometer system, providing a reference for the stage position measuring system, changes to cause a change in the scanning movement direction of the stage, such change can be measured and the scanning movement direction can be corrected. Thus, with respect to the image distortion or resolving power, the pattern transfer performance can be improved significantly.

Next, an embodiment of a device manufacturing method which is based on an exposure apparatus as described above, will be explained.

FIG. 10 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 11:
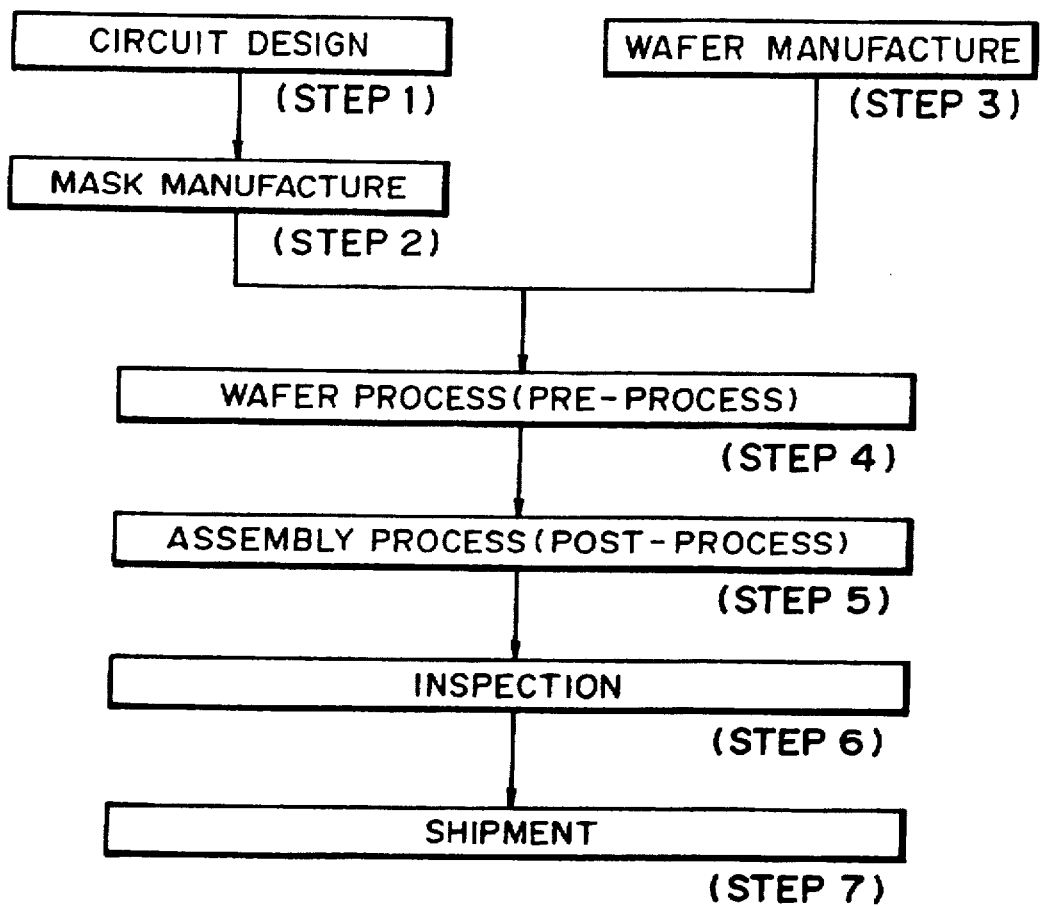
FIG. 11 is a flow chart of device manufacturing processes.
Figure 12:
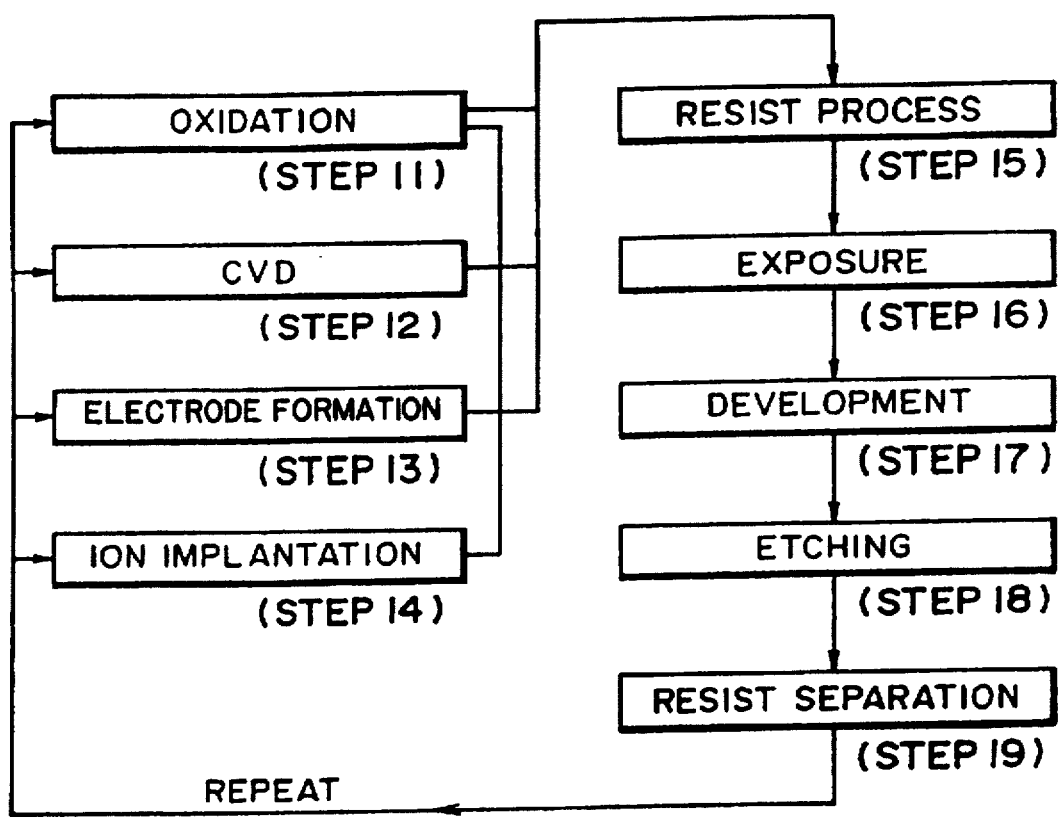
FIG. 12 is a flow chart of a wafer process.
Figure 13:
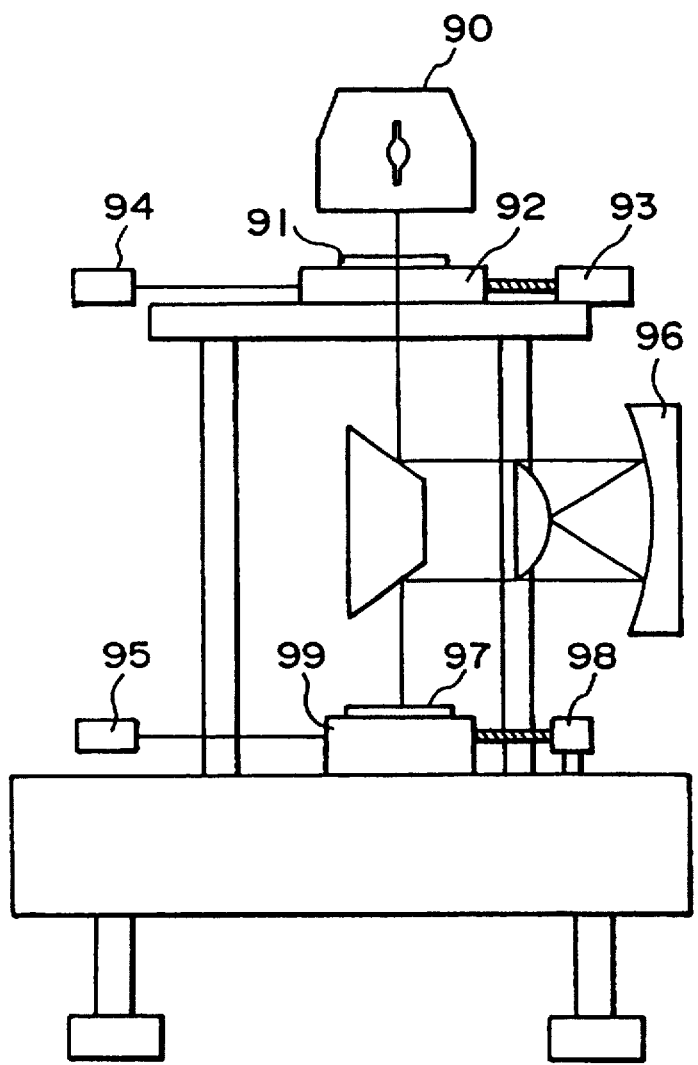
FIG. 13 is a schematic view of a known type of exposure apparatus.

FIG. 11 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus in which a portion of a pattern of an original is projected onto a substrate and in which the original and the substrate are scanned synchronously such that the pattern of the original is transferred to the substrate, said apparatus comprising:

first and second stages, one of which is for scanningly moving the original and the other of which is for scanningly moving the substrate;

measuring means for measuring a deviation of said first stage relative to said second stage in a predetermined direction other than the direction of scanning movement; and adjusting means for adjusting the second stage on the basis of the measurement by said measuring means.

2. An apparatus according to claim 1, wherein said adjusting means adjusts movement of the second stage on the basis of measurement by said measuring means.

3. An apparatus according to claim 1, wherein said measuring means comprises a laser interferometer.

4. An apparatus according to claim 1, wherein said predetermined direction is perpendicular to the direction of scanning movement.

5. An apparatus according to claim 1, wherein said predetermined direction is a rotational direction about an axis which is perpendicular to the original or the substrate.

6. An apparatus according to claim 1, further comprising means for projecting the pattern of the original onto the substrate in a reduced scale, so that reduced-scale patterns are printed in different zones of the substrate.

7. An apparatus according to claim 1, wherein said first stage holds the original and said second stage holds the substrate, and wherein said first stage is provided above said second stage.

8. An apparatus according to claim 7, further comprising a frame member which supports said first stage and a projection optical system for projecting the pattern of the original onto the substrate.

9. An apparatus according to claim 1, wherein at least one of said first and second stages comprises an air bearing for guiding movement of said stages.

10. An exposure apparatus in which a portion of a pattern of an original is projected onto a substrate and in which the original and the substrate are scanned synchronously such that the pattern of the original is transferred to the substrate, said apparatus comprising:

a stage for scanningly moving one of the original and the substrate in a scanning direction;

a reference member provided on said stage and being adapted to be used for measurement of the position of said stage; and detecting means for detecting, with the use of said reference member, the direction of scanning movement of said stage on the basis of measurement, at different locations along the stage movement direction of the position of the stage with respect to a direction different from the scanning direction.

11. An apparatus according to claim 10, further comprising means for correcting the direction of scanning movement on the basis of detection by said detecting means.

12. An apparatus according to claim 10, further comprising a laser interferometer for measuring the position of said stage, wherein said reference mirror member comprises a reference reflection mirror to be used with said laser interferometer.

13. An apparatus according to claim 10, wherein said detecting means comprises an autocollimator provided independently of said stage.

14. An apparatus according to claim 10, further comprising means for projecting the pattern of the original onto the substrate in a reduced scale, so that reduced-scale patterns are printed in different zones of the substrate.

15. An apparatus according to claim 10, further comprising a frame member which supports said stage and a projection optical system for projecting the pattern of the original onto the substrate.

16. An apparatus according to claim 10, wherein said stage comprises an air bearing for guiding movement of said stage.

17. An exposure apparatus in which a portion of a pattern of an original is projected onto a substrate and in which the original and the substrate are scanned in a timed relation such that the pattern of the original is transferred to the substrate, said apparatus comprising:

first and second stages, one of which is for scanningly moving the original and the other of which is for scanningly moving the substrate;

a projection optical system for projecting the pattern of the original onto the substrate;

first measuring means for measuring positional information of said first stage;

second measuring means for measuring positional information of said second stage;

a frame member for supporting at least said first stage and for supporting both of said first and second measuring means; and a flow passageway, provided in said frame member, for flowing therethrough a temperature adjusting medium.

18. An apparatus according to claim 17, further comprising means for projecting the pattern of the original onto the substrate in a reduced scale.

19. An exposure apparatus in which a portion of a pattern of an original is projected onto a substrate and in which the original and the substrate are scanned synchronously such that the pattern of the original is transferred to the substrate, said apparatus comprising:

first and second stages, one of which is for scanningly moving the original and the other of which is for scanningly moving the substrate, wherein said first and second stages are guided by air bearing means;

a projection optical system for projecting the pattern of the original onto the substrate;

first measuring means for measuring positional information of said first stage;

second measuring means for measuring positional information of said second stage; and a frame member for supporting at least said first stage and for supporting both of said first and second measuring means.

20. An apparatus according to claim 19, wherein said first stage holds the original and said second stage holds the substrate, and wherein said first stage is provided above said second stage.

21. An apparatus according to claim 20, wherein said frame member supports said first stage and said projection optical system.

22. An apparatus according to claim 19, wherein said first and second measuring means each comprise a laser interferometer, and further comprising a reference mirror mounted on said stages.

23. An apparatus according to claim 19, wherein a plurality of patterns are transferred to the substrate in accordance with a step-and-scan sequence.

24. An apparatus according to claim 19, further comprising compensating means for reducing an effect of relative deviation of said first and second stages attributable to the movement.

25. An exposure method for the manufacture of microdevices, in which a portion of a pattern of an original is projected onto a substrate and in which the original and the substrate are scanned in a timed relation such that the pattern of the original is transferred to the substrate, said method comprising the steps of:

provided first and second stages, one of which is for scanningly moving the original and the other of which is for scanningly moving the substrate;

measuring a deviation of the first stage relative to the second stage with respect to a predetermined direction other than the scanning movement direction; and adjusting the second stage, on the basis of the measurement in said measuring step.

26. A method according to claim 25, wherein said adjusting step comprises adjusting movement of the second stage on the basis of the measurement in said measuring step.

27. A method according to claim 25, wherein said measuring step comprises measuring the deviation by use of a laser interferometer.

28. A method according to claim 25, wherein the predetermined direction is perpendicular to the scanning movement direction.

29. A method according to claim 25, wherein the predetermined direction is a rotational direction about an axis that is perpendicular to one of the original and the substrate.

30. A method according to claim 25, further comprising projecting the pattern of the original onto the substrate in a reduced scale.

31. An exposure method for the manufacture of microdevices, in which a portion of a pattern of an original is projected onto a substrate and in which the original and the substrate are scanned in a timed relation such that the pattern of the original is transferred to the substrate, said method comprising the steps of:

providing a stage for scanningly moving one of the original and the substrate in a scanning direction;

providing a reference member on the stage, which reference member is adapted to be used for measurement of the position of the stage; and detecting, by using the reference member, the direction of scanning movement of the stage on the basis of measurement, at different locations along the stage movement direction, of the position of the stage with respect to a direction different from the scanning direction.

32. A method according to claim 31, further comprising correcting the direction of the scanning movement on the basis of the detection in said detecting step.

33. A method according to claim 31, further comprising measuring the position of the stage by use of a laser interferometer, wherein the reference member comprises a reference reflection mirror to be used with the laser interferometer.

34. A method according to claim 31, wherein said detecting step uses an autocollimator for detecting the deviation, which autocollimator is provided independently of the stage.

35. A method according to claim 31, further comprising projecting the pattern of the original onto the substrate in a reduced scale.

36. An apparatus for projecting a portion of a pattern of a reticle onto a wafer while scanning the reticle and the wafer so that the pattern of the reticle is transferred to the wafer, said apparatus comprising:

a reticle stage for scanningly moving the reticle, and being guided by first air bearing means;

a wafer stage for scanningly moving the wafer, and being guided by second air bearing means;

a projection optical system for projecting the pattern of the reticle onto the wafer in a predetermined reduction scale;

a first laser interferometer for measuring positional information of said reticle stage;

a first mirror for use with said first laser interferometer and mounted on said reticle stage;

a second laser interferometer for measuring positional information of said wafer stage; and a second mirror for use with said second laser interferometer and mounted on said wafer stage, wherein said first and second laser interferometers are fixed to the same frame member.

37. An apparatus according to claim 36, wherein said wafer stage comprises an X stage, a Y stage, and a θ stage.

38. An apparatus according to claim 36, wherein plural patterns are transferred to the wafer in accordance with a step-and-scan sequence.

* * * * *

UNITED STATES PATENT AND TRADEMARK OFFICE
CERTIFICATE OF CORRECTION

PATENT NO. : 5,796,469
DATED : August 18, 1998
INVENTOR : RYUICHI EBINUMA

Page 1 of 3

It is certified that error appears in the above-identified patent and that said Letters Patent is hereby corrected as shown below:

COLUMN 1:

Line 50, "an image tranferred" should read --a transferred image--.

COLUMN 3:

Line 26, "completed" should read --completed,--; and
Line 61, "is" should read --is a--.

COLUMN 4:

Line 5, "comprises" should read --comprise--.

COLUMN 5:

Line 36, "above," should read --above--.

COLUMN 7:

Line 4, "$Y_w=N_{op}(Y_r+X_r)+\beta N_{st}X_r$" should read
--$Y_w=N_{op}(Y_r+\alpha X_r)+\beta N_{st}X_r$--;

UNITED STATES PATENT AND TRADEMARK OFFICE
CERTIFICATE OF CORRECTION

PATENT NO. : 5,796,469

DATED : August 18, 1998

INVENTOR : RYUICHI EBINUMA

It is certified that error appears in the above-identified patent and that said Letters Patent is hereby corrected as shown below:

COLUMN 7 (Cont.):

Line 48, "a" should be deleted;
   Line 50, "stating," should read --stated--; and
   Line 52, "magnification," should read --magnification--.

COLUMN 8:

Line 51, "Since however," should read --Since, however,--.

COLUMN 9:

Line 54, "performed" should read --be performed--; and
   Line 61, "diving" should read --dividing--.

COLUMN 11:

Line 31, "of" should read --of the--.

UNITED STATES PATENT AND TRADEMARK OFFICE
CERTIFICATE OF CORRECTION

PATENT NO. : 5,796,469
DATED : August 18, 1998
INVENTOR : RYUICHI EBINUMA

It is certified that error appears in the above-identified patent and that said Letters Patent is hereby corrected as shown below:

COLUMN 12:

Line 6, "mirror" should be deleted.

Signed and Sealed this

Third Day of April, 2001

Attest:

NICHOLAS P. GODICI

Attesting Officer     Acting Director of the United States Patent and Trademark Office